United States Patent [19]

Chu et al.

[11] Patent Number: 4,765,400
[45] Date of Patent: Aug. 23, 1988

[54] CIRCUIT MODULE WITH PINS CONDUCTING HEAT FROM FLOATING PLATE CONTACTING HEAT PRODUCING DEVICE

[75] Inventors: Richard C. Chu; Jeffrey C. Eid; Michael L. Zumbrunnen, all of Poughkeepsie, N.Y.

[73] Assignee: International Business Machines Corp., Armonk, N.Y.

[21] Appl. No.: 38,088

[22] Filed: Apr. 14, 1987

[51] Int. Cl.⁴ .............................................. F28F 7/00
[52] U.S. Cl. .................................... 165/185; 357/81; 361/385
[58] Field of Search .................. 165/80.2, 80.3, 80.4, 165/185; 174/16 HS; 357/81; 361/385, 386

[56] References Cited

U.S. PATENT DOCUMENTS 4,226,281 10/1980 Chu ...................................... 165/185
4,649,990 3/1987 Kurihara et al. .................... 165/80.4

FOREIGN PATENT DOCUMENTS 67248 4/1986 Japan .................................... 357/81

OTHER PUBLICATIONS

IBM Bulletin, "High Performance Air Cooled Module", vol. 28, No. 7, Dec. 1985, pp. 3058-3059.
IBM Bulletin, "Programmable Heat Sink Device for Thermal Enhancement", Bakos et al., vol. 22, No. 3, Aug. 1979, p. 957.
IBM Bulletin, "Chip-Cooling Apparatus . . . ", vol. 28, No. 3, Aug. 1985, p. 1300.
IBM Bulletin, "Circuit Package with Spring-Loaded Pistons", vol. 28, No. 7, Dec. 1985, p. 3066.

Primary Examiner—Michael Koczo
Assistant Examiner—Peggy Neils
Attorney, Agent, or Firm—W. S. Robertson

[57] ABSTRACT

An improved TCM-like circuit module for cooling an array of chips mounted on a substrate. The substrate and the chips are enclosed by components that include a barrier plate that separates the chip space from a coolant such as air or chilled water. A floating plate contacts a heat transfer surface of each chip and forms a local heat sink. Pins conduct heat from the floating plate. In one embodiment, one end of each pin is rigidly attached to the floating plate and the other end is located in a cavity in the barrier plate. In a second embodiment, the cavities are formed in the floating plate and the barrier plate rigidly supports the pins. In the second embodiment, the pins can be extended through the barrier plate to contact the coolant directly.

8 Claims, 6 Drawing Sheets

CIRCUIT MODULE WITH PINS CONDUCTING HEAT FROM FLOATING PLATE CONTACTING HEAT PRODUCING DEVICE

FIELD OF THE INVENTION

This invention relates a circuit module with improved cooling.

INTRODUCTION

A well known circuit module that is called a thermal conduction module (TCM) illustrates some of the objects and features of this invention, and it will be helpful to review the general structure of a TCM. A TCM is used in the IBM 3090 processor and is shown for example in U.S. Pat. No. 3,993,123 to Chu, Gupta, Hwang and Simons. Some TCM-like devices will be reviewed in this introduction, and the term "TCM" will be used generically for all of these devices.

As the term "module" suggests, a TCM is a repeating unit in a data processor. Several TCM's are mounted in a rectangular array on a circuit board. In this description it will be helpful to suppose that the board is mounted in a horizontal plane so that the terms "upper" and "lower" can be used in describing the components.

A TCM has a chip carrier (also called a substrate) that has the shape of a thin square several inches on a side. Flat conductive elements called solder pads are located on the upper surface of the chip carrier, and the chips are electrically and mechanically connected to the pads in a row and column array. A hundred or so chips are mounted on the chip carrier. Connector pins extend from the lower surface of the chip carrier and plug into sockets on the board, and layers of conductor patterns inside the chip carrier form a conductive path between the pads and the connector pins.

A metal structure called a "hat" or "cap" fits over the chip carrier and the chips. The chip carrier and the hat are sealed along their rectangular edges and form an enclosure for the chips. The hat has downwardly opening cylindrical holes that carry cylindrical metal pistons that are spring loaded to rest on the chips so that the pistons conduct heat from the chips to the hat. In some references, piston-like structures are called "studs" or "posts". In this introduction, the term "piston" or "piston counterpart" will be used to designate any of these structures that conduct heat from a chip to the hat. A more descriptive term "pin" will be introduced later.

The piston is made separable from the chip so that the chip carrier and the chips can be assembled and tested before the hat and the pistons are attached to the chip carrier to enclose the chips. The piston is made movable with respect to the hat so that it can adjust to variations in the chip position. These variations are made up of variations of the surface of the substrate with respect to a reference plane, variations in the height of the chip above the substrate surface, and tilt in the chip. Gaps exist where the end of a piston only partially contacts the chip and where the sides of a piston only partially contact the cylindrical wall of the hole in the hat. These gaps account for much of the thermal resistance in the heat transfer path, and much of the development in this art is directed to reducing the thermal resistance of the gaps.

The thermal resistance of a segment of a heat transfer path is commonly expressed as degrees Celsius per watt: the ratio of the temperature difference between the ends of the segment to the heat energy transferred through the segment. The thermal resistance of a gap can be reduced by increasing the area of the surfaces, by making better contact between the surfaces at the gap, and by filling the gap with a good heat transfer material such as helium, oil, or grease.

Most of the TCM's that will be described here have two gaps in the thermal conduction path: one between the chip and the piston (or piston counterpart) and another between the piston and the hat. The gap between the chip and the piston is aggravated by the fact that the soldering process of joining the chip to the substrate commonly leaves the chip at an angle to the substrate. The bottom of the piston is commonly beveled so that some contact is made regardless of the angle of the chip. The space between the piston and the inside walls of the hat can be made large enough to allow the piston to take on the tilt of the chip so that a flat ended piston can make full contact with the chip. However, it is a general object of this invention to avoid problems associated with these structures.

In U.S. Pat. No. 4,498,530 to Lewis D. Lipschutz, a rigid cover element or cap 22 separates the chip enclosure space from a colorant or from a separable cold plate. The upper surface of element 22 is in contact with the coolant and the lower surface 24 faces the chips. A thermal conduction element or thermal bridge 20 is arranged to conduct heat from the upper surface of a chip to the cover plate. Thermal element 20 is thus the counterpart of a piston in a conventional TCM. Element 22 has an upper part connected to the lower surface of element 22 and a lower part that rests on the back of the chip. The upper and lower parts have leaf elements 36 and 42 respectively that are interleaved for good heat transfer.

SUMMARY OF THE INVENTION

Our new TCM has a rigid barrier plate that separates the chip space from a coolant. Each chip has a floating plate and a set of pins that extend vertically between the floating plate and the barrier plate. In one embodiment, the lower end of each pin is rigidly attached to the floating plate and the upper end is movably located in a cavity in the barrier plate. In a second embodiment, the cavities are formed in the floating plate and the pins are rigidly supported by the barrier plate. In the second embodiment, the pins can be extended through the barrier plate to contact the coolant directly or the barrier plate can form part of the heat transfer path. If the pins extend through the plate, they provide a thermally conductive path that is mechanically continuous without intervening welds or other discontinuities that might increase the thermal resistance.

The pins provide a better heat transfer path than the leaf structure of Lipschutz, partly because the area between the cylindrical pins and the walls of the cavities can be made larger than the area of the interleaved leaf elements.

Other objects and advantages of the invention will be evident from the description of our preferred embodiment.

THE DRAWING

FIG. 5 also shows additional structural details that are typical of the other embodiments: a spring that holds the floating plate against a chip and a dielectric layer formed on the surface of the floating plate that contacts the chip.

THE MODULE OF FIG. 1—CONVENTIONAL FEATURES

Figure 1:
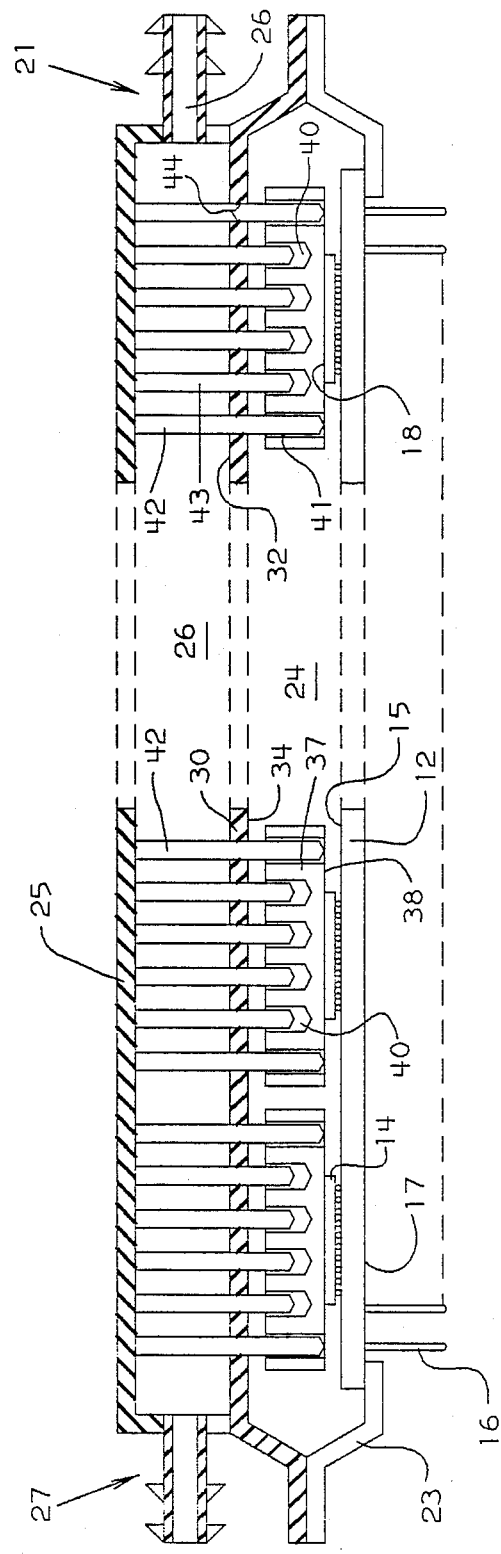
FIG. 1 is a section view of the preferred circuit module of our invention.

The drawing shows a substrate 12 with semiconductor chips 14 mounted on the upper surface 15 and electrical pins 16 projecting from the lower surface 17. The terms upper and lower are arbitrary as in the preceding discussion. The uppermost surface 18 of the chip, commonly called the back of the chip, is functionally a heat transfer surface of the chip. As seen from the top, the substrate is rectangular and it carries the chips in a row and column array. The chips are spaced apart to expose rows and columns of the upper surface of the substrate where some of the electrical connections are made.

A hat 21 and a flange 23 cooperate with the substrate 12 to form an enclosed space 24 for the chips. (A sealing ring which is conventional is not shown.) As is conventional, the chip space is preferably filled with oil or grease for improved heat transfer across the gaps. To fill the chip space with oil, the module is assembled, the air is evacuated from the chip space, and the chip space is back filled with oil. If grease is used, it can be located just in the cavities. As the pins enter the cavities, the grease is spread upward along the surface of the pins (or downward in FIG. 8). The grease retains its position if the TCM is mounted in a different orientation. Alternatively, the chip space can be completely filled with grease. The improved heat transfer capability of our circuit module will make it possible to use oil instead of grease in some applications or to avoid either oil or grease for lower powered circuits.

The hat is arranged to be attached to a separable cold plate or, as in FIG. 1, to have an integral cold plate with an enclosed space 26 for a liquid coolant. The preferred coolant is chilled water. The coolant space is enclosed partly by a top 25, and the cold plate includes an inlet pipe 27 and an outlet pipe 28 for circulating the coolant from a source that is not shown.

From a more general standpoint, these components form a circuit module and the chips are an example of a heat producing device of the circuit module.

THE BARRIER AND SUPPORT PLATE

The hat includes a plate 30 that forms a barrier between the chip space 24 and the coolant space 26. In the embodiment of FIG. 1 the plate also forms a support foer the pin structure, and it can be called a barrier and support plate when it performs both functions. The preferred barrier plate is a discrete component (to simplify manufacture), as FIG. 1 illustrates. The upper surface 32 of the barrier plate forms at least part of the bottom of the coolant space 26 of the integrated cold plate and is in contact with the coolant. The lower surface 34 of the barrier plate forms part of the top of the chip space 24 and overlies at least the area of the substrate where the chips are located. The barrier plate is preferably made of metal, but for an initial understanding of the invention it will be helpful to suppose that the barrier plate itself is a poor heat conductor. The barrier plate is functionally similar to the cover part of Lipschutz, and a variety of equivalent structures can be suggested from the simplified structure shown in the drawing.

THE FLOATING PLATE

For each chip, our circuit module has a floating plate 37 of a material having a low thermal resistivity. Plate 37 contacts the back of the chip, and it floats in the sense that a piston floats in the TCM of Chu et al: it is separable from the chip during manufacture or repair and it adapts to the position of the chip (both height and tilt). At least in the area where the lower surface 38 of the plate contacts the back 18 of the chip, this surface is made smooth for good heat transfer contact with the back of the chip.

A spring (39 in FIG. 5) holds the plate against the back of the chip for good heat transfer contact. Preferably the spring has a central part that bears upwardly against the bottom 34 of the barrier plate and four fingers that bear downward against the floating plate 37 at evenly distributed points.

The plate has the general shape of the underlying chip but ordinarily enough space exists between chips for the plate to extend beyond the edges of the chip. With the wider floating plate, heat flows laterally outward (an effect called heat spreading) and the greater cross sectional area of the floating plate is used to provide a lower thermal gradient and a lower thermal resistance. (The module of FIG. 3 has a different structure for heat spreading.) Alternatively, a very large chip can be cooled by several floating plates that are approximately sub-multiples of the size of the chip.

The floating plate 37 has an array of cavities of two different configurations 40, 41 (see FIG. 2) that receive the pins 42, 43 respectively as will be explained later. The cavities have cylindrical side walls 45. Cavities 40, which overlie the chip, have a bottom surface 46 and the lower surface of the floating plate is unbroken. Cavities 41 do not overlie the chip and can be extended completely through the floating plate for increased area of the side walls 45.

The low thermal resistance material of the plate will ordinarily be a metal such as copper. Other materials such as silicon carbide, beryllium oxide, and diamond have good heat transfer properties and good electrical insulating properties and in time may be available for these applications.

THE PINS

The pins are formed in a pattern that is square as seen from the top (because the chips are square as seen from the top), and FIG. 1 shows the pins in an array of six rows and six columns. Ordinarily the pins will be equally spaced apart and any pattern that achieves equal spacing will be suitable. As seen from the top, the cross sectional area of the pins is approximately equal to the area of the floating plate outside the cavities (because heat flows serially through floating plate and the pins.) From a more general standpoint, these areas are proportional to the thermal resistivities of materials of the pins and the floating plate.

A six by six array as shown in FIG. 1 is preferred for improved heat transfer, but a four by four array will provide sufficient heat transfer for many circuit modules and it is preferred because it is simpler to manufacture. In the referred four by four pin array, all cavities have the configuration of cavities 40.

In the module of FIG. 1, the pins extend through holes 44 in barrier and support plate 30 and are attached to the plate by a suitable technique such as welding, brazing, soldering, or use of adhesives. (In the embodiment of FIG. 8, described later, the barrier plate does not support the pins.)

One advantage of our module as compared with the module of Lipschutz is that the pins are symmetrical with the two dimensions of tilt of the chip surface.

THE PIN LENGTH—FIG. 2

Figure 2:
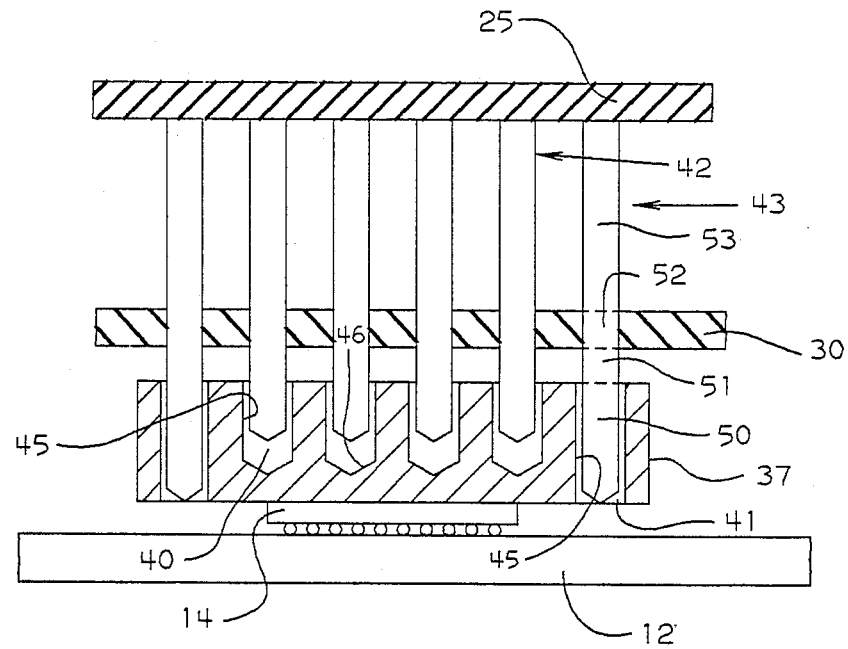
FIG. 2 is a larger section view of one floating plate, the associated pins, and parts of the rigid barrier and the top of the coolant enclosure.

The general structure of FIG. 2 will be familiar from the description of FIG. 1. For this explanation of the thermal properties of the pin, FIG. 2 shows the pin divided by dashed lines into four parts: a cavity engagement length 50 inside the plate cavity, an exposed part 51 between the top of the floating plate and the bottom of the rigid plate, a mounting part 52 in contact with the rigid plate, and a fin part 53 that extends into the coolant. The exposed part 51 has a small length that permits the floating plate to adjust to the chip height without interference with the lower surface 34 of the rigid plate. This length can be considered to be fixed for this explanation. The mounting part 52 is also made as short as possible and can be considered to be fixed.

The fin part 53 can be analyzed as a conventional pin fin. Briefly, the chip power, the chip temperature and the coolant temperature are established exogenously. The temperature of the fins is established by the chip power and the thermal resistance between the fins and the chip. The length of the fins is selected to provide the appropriate resistance.

THE LENGTH OF THE CAVITY ENGAGEMENT PART OF THE PIN

For this discussion, the pin diameter is assumed to be fixed by the requirement, already explained, that the cross sectional area of the cavities is about the same as the cross sectional area of the floating plate outside the cavities. The distance between the end of a pin and the bottom of the cavity is relatively large and the heat transfer path through the end of the pin can be ignored in this discussion. The thermal resistance between the pins and the floating plate is established primarily by the horizontal length of the gap between the side of a pin and the side wall of a cavity, the surface area of this gap (a function of the cavity engagement length), and the heat transfer properties of the material that fills the gap.

The gap distance is measured from the cylindrical surface of the pin to the adjacent surface of the cavity when the pin is centered in the cavity (the radius of the cavity minus the radius of the pin). The actual position of the pin in the gap is not significant. In practice, the length of the gap is established by limitations in the manufacturing processes. A gap of about 2 mil (thousandths of an inch) is practicable and provides sufficient space for chip tilt and for displacing oil or grease when the pins are pushed into the cavities during manufacturing or for admitting oil or grease if the chip space is filled after assembly.

An increase in the cavity engagement length improves heat transfer by increasing the gap area but it also impedes heat transfer by increasing the length of the path. At an optimum pin length, the improvement from a differential increase in the gap area would be equally offset by the increased path length. For a typical circuit module having sixteen pins in a four by four array, the optimum cavity engagement length of a pin is on the order of three millimeters for a gap filled with a thermal grease to seven millimeters for a gap filled with mineral oil.

To compare the heat transfer area of pins with the area of the leaf elements of Lipschutz, suppose that the vertical overlap of a pin and a cavity equals the vertical overlap of the upper and lower leaf elements. Also suppose that as seen from the top a row of pins occupies the same area as a lower leaf element. The number of rows of pins equals the number of lower leaf elements, and the number of columns of pins corresponds to the horizontal length of a leaf element. It can be seen (or shown mathematically) that the circumference of the pins is greater than the perimeter of the leaf element.

AN ADVANTAGE

Chip temperatures were measured in an 11 by 12 array of chips in a test module similar to FIG. 1 and were found to be closely uniform. Variations in chip temperature are commonly caused by normal variations in manufacturing the components that are separated by gaps. Our test module was manufactured and assembled by techniques that were intended to closely approximate the techniques that would be used in normal production of the module, and we attribute this advantage in uniformity to the fact that the module has a relatively large gap between the pin and the wall of the cavity. Small variations in this gap have less effect than similar variations in a module in which gaps must be be made very small to maintain low thermal resistance. Our module can be made with larger gaps because the pins and cavities have a large surface area for heat transfer.

ELECTRICAL ISOLATION

In a conventional TCM the pistons and the hat are kept at electrical ground and the back of the chip is at some potential established by the circuits. The potential at the back of the chip is usually not ground, and the chip must be electrically insulated from the piston and hat. The back of the chip can be insulated in some way that is not relevant to our circuit module, or other components in the heat transfer path can be insulated. Techniques for providing this insulation have been reported in several references.

The lower surface 38 of the floating plate 37 can be given a layer of aluminum oxide (55 in FIG. 5), as has been suggested for other floating plate structures. Unfortunately, these layers can not yet be made as smooth as the back of the chip and their rough surface increases the thermal resistance. The preferred cylindrical shape of the pins of our module makes them particularly adapted to conventional cladding with aluminum which is oxidized to a non-conducting alumina. The rough surface of the anodized pins does not significantly raise the thermal resistance because the pins and the cavity walls make only partial contact in any case.

THE MODULE OF FIG. 3

The heat carried by the barrier and support plate 30 has been ignored so far in this explanation. Also, in these modules, the floating plate 37 has been extended into the space between rows and columns of chips sufficiently for at least one row (and column) of pins that do not overly the chip. The width of the floating plate is optional, and in the module of FIG. 3 the floating plate is made narrower and the barrier plate is modified to provide lateral heat spreading.

Figure 3:
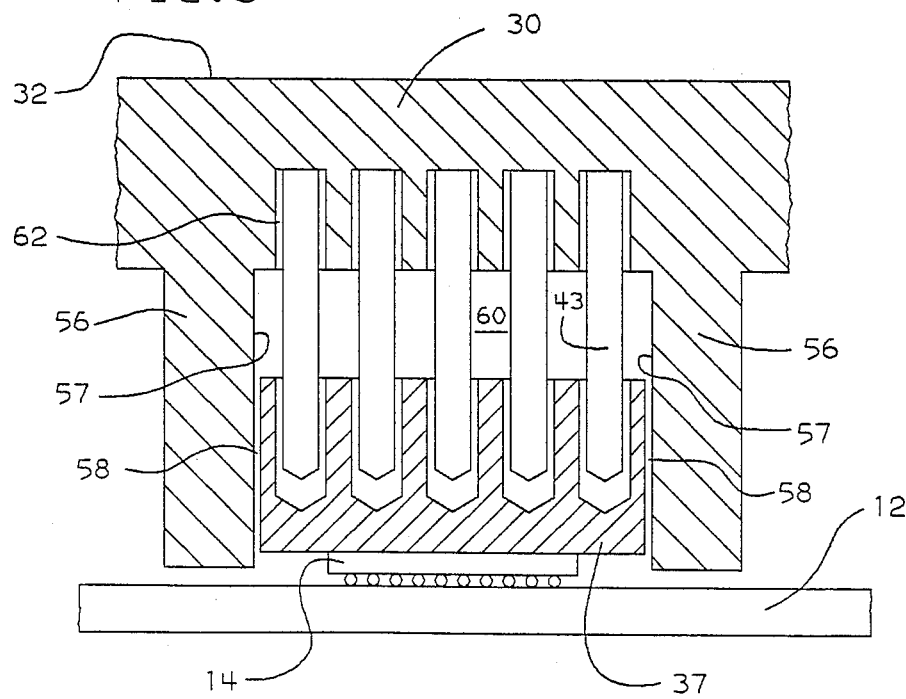
FIG. 3 is similar to FIG. 2 and shows a modified floating plate and barrier structure.
Figure 4:
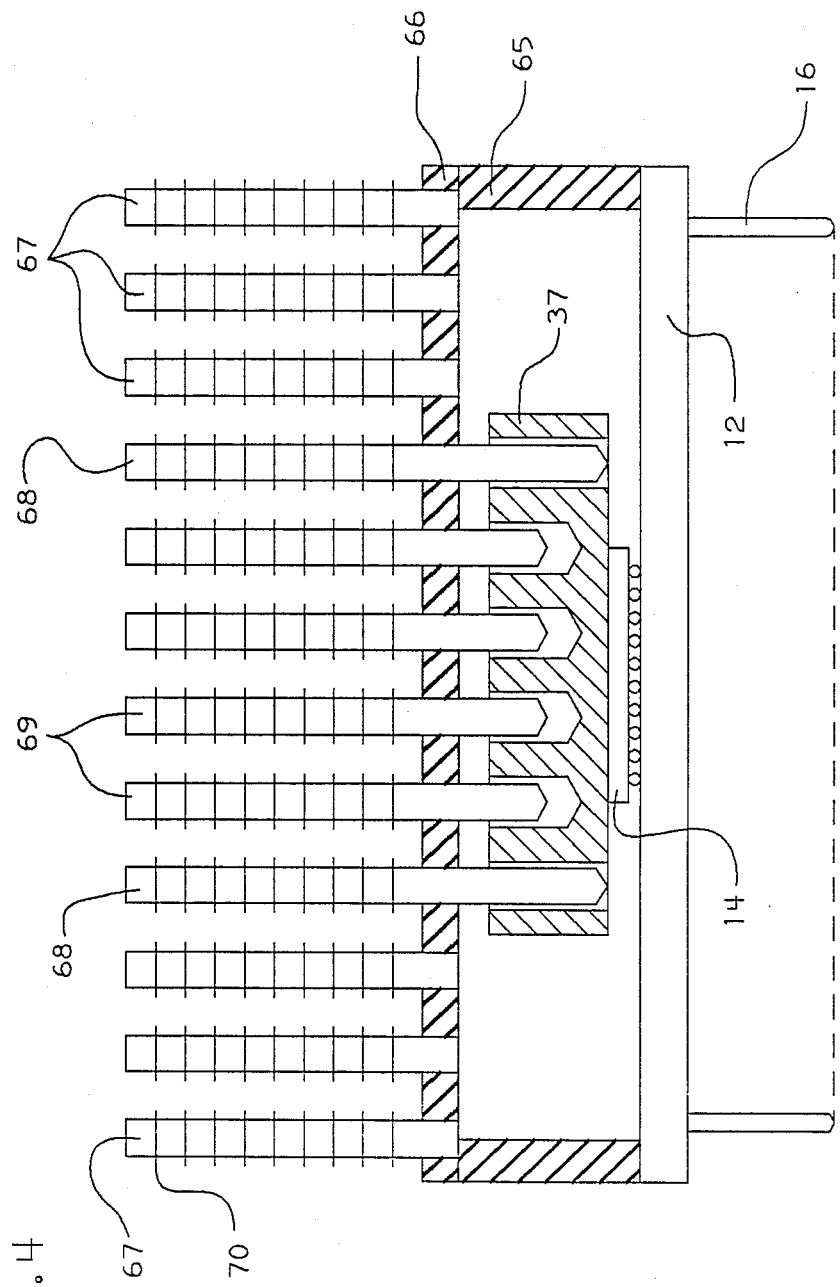
FIG. 4 is a section view of a circuit module in which the pins are provided with fins for air cooling for a single chip or a small number of chips that can be air cooled.

In the embodiment of FIG. 3 the floating plate does not extend for approximately the chip to chip pitch. A part 56 of the barrier plate that overlies the exposed part of the substrate extends downward to about chip level with the sides 57 of the extension 56 close to the edges 58 of the floating plate for heat transfer from the edges of the plate to the extension and from the extension 56 to the barrier and support plate 30.

The downward extension 56 can be formed by starting with a thick barrier and support plate and first sawing thin slots in rows and columns at positions that define the vertical surfaces 57. As seen from the top, the rectangles of parts 56 lie along rows and columns, separated by small squares at the intersections of the rows and columns and adjacent to the sides of larger squares where a floating plate will be positioned. The material in each large square is then milled out to provide the space 60 for the chip and floating plate.

The module of FIG. 3 also differs from the module already described by having the pins 43 terminate in the barrier and support plate 30. The pins are attached to the barrier plate in a way that provides good heat conduction from the pins to the plate. The drawing shows the pins located in holes filled with solder 62 or other suitable material. A separable cold plate, not shown, is attached to the upper surface 32 of the barrier and support plate.

THE MODULE OF FIG. 4

The substrate 12, electrical pins 16, the single chip 14, and floating plate 37 will be familiar from the description of these components in FIGS. 1 and 2. An enclosure for the chip has sides 65 and a plate 66 that supports the pins 67, 68, 69 and forms a barrier between the chip space and the air outside the module. The pins have fins 70 on the part that extends into the coolant space above the plate, and the module has a single chip, as shown, or a number of chips that can be air cooled. Preferably the barrier and support plate 66 is made of a good heat conducting material and pins 67 are mounted on the plate outside the area that overlies the floating plate 37.

THE MODULE OF FIG. 5

Figure 5:
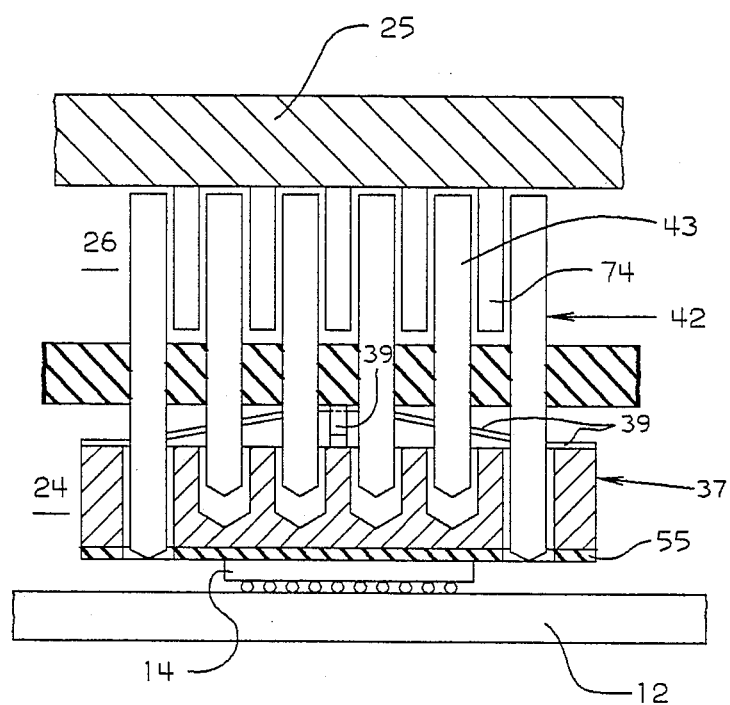
FIG. 5 is similar to FIG. 2 and shows a different structure for cooling the tops of the pins.

FIG. 5 shows the spring 39 and the anodization layer 55 that were introduced in the description of FIG. 1. FIG. 5 also shows a different structure for an integrated cold plate. The top 25 for the coolant space 26 supports downwardly extending pins 74 that are located in offset rows and columns between upper parts of the pins. This cold plate structure is similar to the cold plate described in Chu et al., U.S. Pat. No. 3,524,497, and FIG. 5 illustrates that a variety of techniques can be used for cooling the tops of the pins. See also "Cold Plate for Circuit Module with Partial Flow Diverters Locatable in a Pattern to Establish a Selected Flow Pattern for Cooling Water" by J. C. Eid and M. L. Zumbrunnen. A pre-publication copy is submitted with this application.

THE MODULES OF FIGS. 6 AND 7

In these modules, the floating plate 37 and the lower part of the pins 42, 43 are similar to the corresponding components of FIG. 2. The upper parts of the pins are attached to the hat structure in the same general way that has been described for FIG. 3. (The solder 62 is not shown.) FIG1. 6 shows a separable cold plate and FIG. 7 shows an integrated cold plate.

Figure 6:
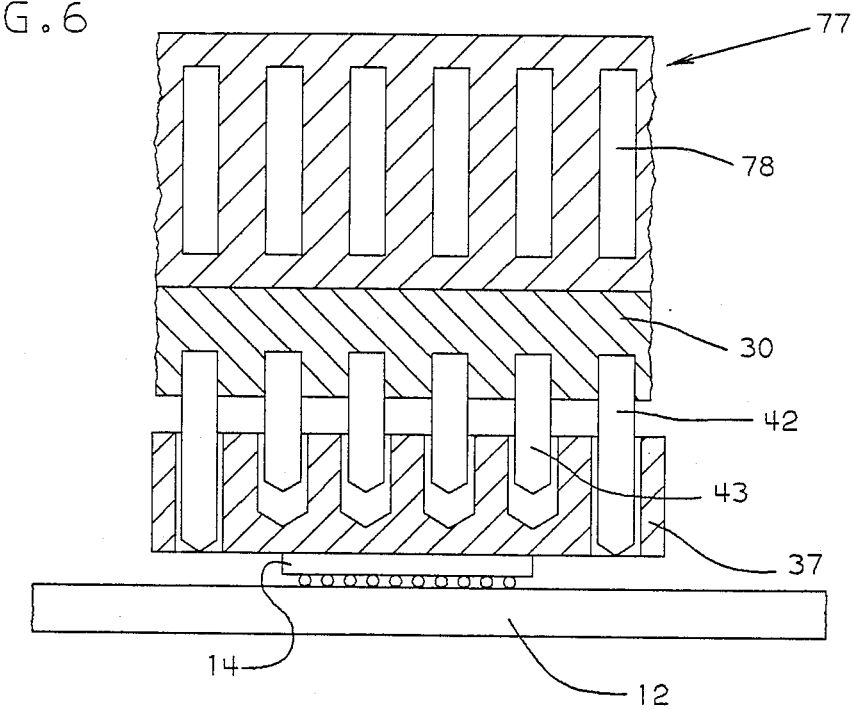
FIG. 6 is similar to FIG. 2 and shows a detachable cold plate structure.

In FIG. 6 the cold plate has a body 77 of heat conducting material such as copper which is shaped to provide a coolant space in the form of channels 78. In FIG. 7 a cold plate 80 has channels 81 for the liquid coolant and a separate top 82 that closes the channels. Both cold plates have an inlet and an outlet connection as shown in FIG. 1. FIGS. 6 and 7 will suggest a wide variety of cold plate structures that can be used with our circuit module.

THE MODULE OF FIG. 8

Figure 7:
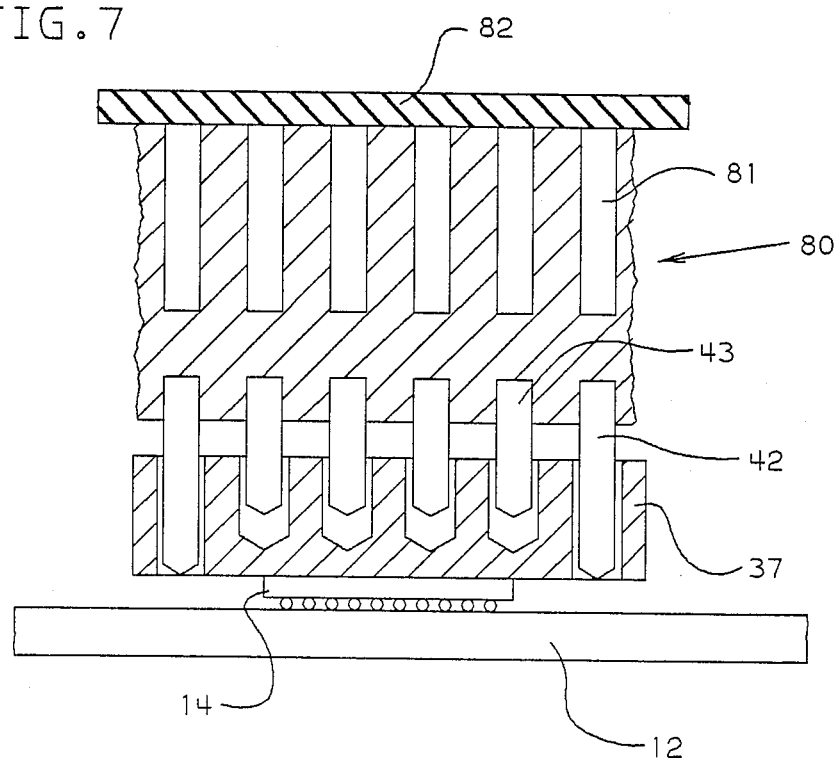
FIG. 7 is similar to FIG. 6 and shows an integrated cold plate structure.
Figure 8:
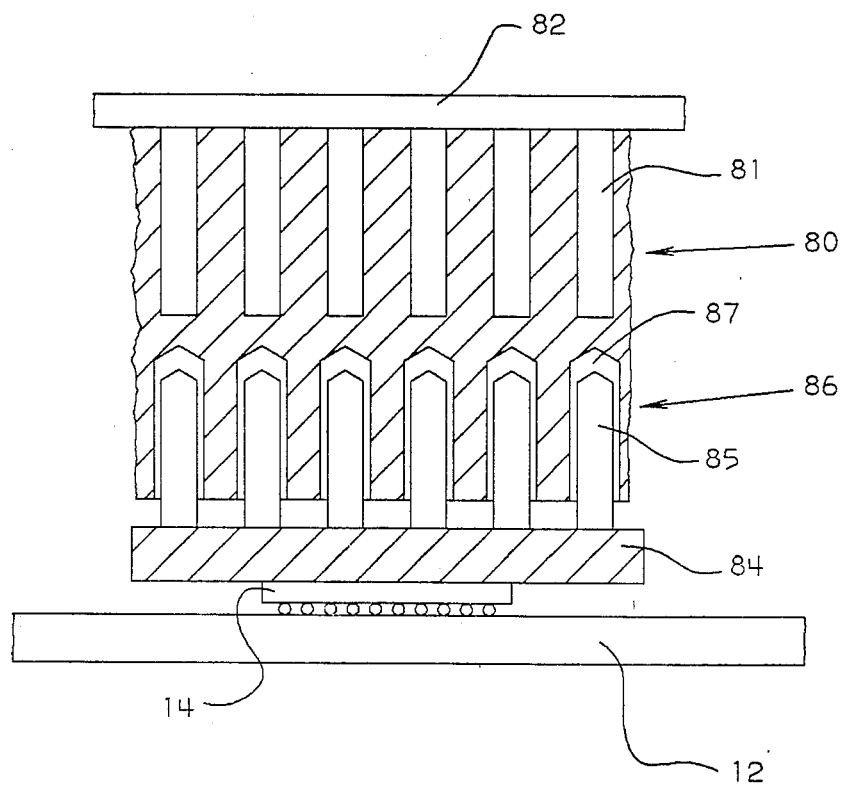
FIG. 8 shows a circuit module with the two gaps arranged oppositely: the bottoms of pins are fixed to the floating plate and the tops of the pins fit into cylindrical holes in the barrier plate.

In FIG. 8, the cold plate structure is integrated and is similar to FIG. 7. This feature of FIG. 8 is arbitrary, and the separable cold plate can be used. The substrate 12 and representative chip 14 are similar to the corresponding components in the other Figs. The floating plate 84, pins 85, and barrier plate 86 are approximately the complement of these components in the other Figs. The pins 85 are rigidly attached to the floating plate 84 in a suitable way as already explained in the description of the pins 42, 43 and barrier and support plate 37. Cavities 87 are formed in the barrier plate and the pins 85 fit into the cavities in the same general way that pins 43 fit into cavities 40 in FIG. 2.

OTHER EMBODIMENTS

The embodiments of the invention that have been described represent two relationships between the floating plate, the pins, and the barrier and/or support plate: the pins can be rigidly attached to the floating plate or to the barrier plate; the other plate has cavities that receive the ends of the pins. The heat transfer performance of the module is slightly better when the cavities are located in the barrier plate. Because attaching the pins to either plate is more difficult than forming the cavities, it may also be an advantage to attach the pins to the floating plate: when manufacturing mistakes are made in attaching the pins, a smaller component is scrapped.

Both separable and integrated cold plates have been described. As is known, a separable cold plate is easier to manufacture and to service but an integrated cold plate can provide more cooling. Note that with a separable cold plate (FIGS. 3 and 6) the pins can not project into the coolant space. With an integrated cold plate, the pins can project into the coolant space as in FIGS. 1, 2, 4, 5 for increased heat transfer or the pins can end at the barrier and support plate as in FIG. 7.

Other features of the module have been shown in several specific forms and these features can be used in various permutations, as will be apparent. Some of these other features are representative of an extensive prior art that will be useful in a specific application of our invention.

What is claimed:
1. In a circuit module which has
   a planar dielectric substrate and an array of one or more heat producing devices such as semiconductor chips mounted on a surface of the substrate, the substrate being oriented for purposes of terminology in a horizontal plane with the devices on the upward facing surface, each of the devices having an upper surface that is substantially flat, a plate cooperating with the substrate to form at least part of an enclosure for a space containing the heat producing devices and overlying the devices and forming a barrier between the devices and a coolant, improved means for transferring heat from the devices to the coolant, comprising, at least one floating plate for each device, and means for holding the lower surface of the floating plate in heat transfer contact with the upper surface of the associated device, a set of pins for each said floating plate, said barrier plate supporting said pins with the pins spaced apart in a row and column array, said pins extending vertically downward to said floating plate, said floating plate having cavities for receiving the lower ends of the pins for heat transfer through a gap that permits the floating plate to adjust to variations in the position of the associated device, said pins extending upward through said barrier and support plate into the coolant space where the tops of the pins form fins for transferring heat to the coolant, whereby said pins form a continuous path for conduction independent of the barrier and support plate.

2. The circuit module of claim 1 wherein the size of at least one device is approximately a multiple of the size of the floating plate and wherein said module includes a plurality of said floating plates in heat transfer contact with said one device and a set of pins for each floating plate.

3. The circuit module of claim 1 wherein the pins are cylindrical in cross section and the cavities have cylindrical walls.

4. The circuit module of claim 1 wherein said barrier and support plate is of a heat conducting material and forms at least part of said heat transfer path between said pins and the coolant.

5. The circuit module of claim 1 wherein the devices are spaced apart on the substrate and wherein the floating plate extends beyond the edges of the device into the space between devices sufficiently to provide an improved heat transfer path through heat spreading.

6. The circuit module of claim 4 wherein said barrier plate is of a heat conducting material and said pins are attached in a thermal conductive relationship to said barrier and support plate whereby said barrier and support plate forms at least part of said heat transfer path between the pins and the coolant.

7. The circuit module of claim 5 wherein
the rows and columns of pins are equally spaced apart by a distance that is related to the size of the heat producing devices such that there is at least one row or column of pins immediately outside each edge of each device and there are at least two rows or columns of pins between adjacent edges of adjacent devices, and
said floating plate extends beyond the edges of the associated device sufficiently to underlie a row or column of pins along each underlying edge of the floating plate and
said floating plate has cavities to receive said pins along each edge.

8. The circuit module of claim 7 wherein said cavities for said row or column of pins along each underlying edge of the floating plate extend through the plate and wherein the corresponding pins extend approximately through the plate for extended contact between the pin and the plate.

* * * * *